United States Patent
He et al.

(10) Patent No.: US 10,446,776 B2
(45) Date of Patent: Oct. 15, 2019

(54) ORGANIC LIGHT-EMITTING DIODE (OLED) DISPLAY PANEL AND MANUFACTURING METHOD

(71) Applicants: Shanghai Tianma AM-OLED Co., Ltd., Shanghai (CN); Tianma Micro-Electronics Co., Ltd., Shenzhen (CN)

(72) Inventors: Wei He, Shanghai (CN); Shuang Cheng, Shanghai (CN); Jinghua Niu, Shanghai (CN); Xiangcheng Wang, Shanghai (CN); Yuji Hamada, Shanghai (CN); Chen Liu, Shanghai (CN)

(73) Assignees: SHANGHAI TIANMA AM-OLED CO., LTD., Shanghai (CN); TIANMA MICRO-ELECTRONICS CO, LTD., Shenzhen (CN)

(*) Notice: Subject to any disclaimer, the term of this patent is extended or adjusted under 35 U.S.C. 154(b) by 0 days.

(21) Appl. No.: 15/592,609

(22) Filed: May 11, 2017

(65) Prior Publication Data

US 2017/0250234 A1 Aug. 31, 2017

(30) Foreign Application Priority Data

Nov. 9, 2016 (CN) .......................... 2016 1 0986284

(51) Int. Cl.
*H01L 27/32* (2006.01)
*H01L 51/00* (2006.01)
(Continued)

(52) U.S. Cl.
CPC ...... *H01L 51/5012* (2013.01); *H01L 51/5076* (2013.01); *H01L 51/5265* (2013.01);
(Continued)

(58) Field of Classification Search
CPC ............ H01L 51/5012; H01L 51/5076; H01L 51/5265

See application file for complete search history.

(56) References Cited

U.S. PATENT DOCUMENTS

| | | | | |
|---|---|---|---|---|
| 2013/0240851 | A1* | 9/2013 | Seo | H01L 51/5262 257/40 |
| 2013/0285021 | A1* | 10/2013 | Jenekhe | C07D 215/06 257/40 |

(Continued)

FOREIGN PATENT DOCUMENTS

| | | |
|---|---|---|
| CN | 103904103 A | 7/2014 |
| WO | 2015092397 A | 6/2015 |

*Primary Examiner* — William F Kraig
*Assistant Examiner* — Vicki B. Booker
(74) *Attorney, Agent, or Firm* — Anova Law Group, PLLC

(57) ABSTRACT

The present disclosure provides an OLED display panel, including a substrate and a plurality of pixel regions disposed on the substrate and emitting light in different colors. A pixel region includes a first electrode, a first auxiliary light-emitting layer, a light-emitting layer, a second auxiliary light-emitting layer, and a second electrode. A microcavity structure is formed between the first electrode and the second electrode. The second auxiliary light-emitting layer includes at least a first sub-auxiliary light-emitting layer. The second auxiliary light-emitting layer corresponding to the pixel regions emitting light in at least one color also includes a second sub-auxiliary light-emitting layer. At least one of the first sub-auxiliary light-emitting layer and the second sub-auxiliary light-emitting layer is made of at least a first electron-type material. The second sub-auxiliary light-emitting layer has a zero-field electron mobility greater than or equal to a pre-determined threshold.

18 Claims, 4 Drawing Sheets

(51) Int. Cl.
    *H01L 51/50*     (2006.01)
    *H01L 51/52*     (2006.01)

(52) U.S. Cl.
    CPC ....... *H01L 27/3211* (2013.01); *H01L 51/0072* (2013.01); *H01L 2251/55* (2013.01)

(56) References Cited

U.S. PATENT DOCUMENTS

| | | | | |
|---|---|---|---|---|
| 2013/0328041 A1* | 12/2013 | Yokoyama | ............. | C09K 11/06 257/40 |
| 2014/0035457 A1* | 2/2014 | Yoon | ....................... | H05B 33/28 313/504 |
| 2017/0155076 A1* | 6/2017 | Xu | ....................... | H01L 27/3248 |

* cited by examiner

ORGANIC LIGHT-EMITTING DIODE (OLED) DISPLAY PANEL AND MANUFACTURING METHOD

CROSS-REFERENCES TO RELATED APPLICATIONS

This application claims the priority of Chinese Patent Application No. CN201610986284.5, filed on Nov. 9, 2016, the entire contents of which are incorporated herein by reference.

FIELD OF THE DISCLOSURE

The present disclosure generally relates to the display technology and, more particularly, relates to an OLED display panel and a manufacturing method thereof.

BACKGROUND

Organic light-emitting diodes (OLEDs) are also known as organic electroluminescent device. Driven by an electric field, the light-emitting material in the OLED emits light through carrier injection and recombination. Compared to liquid crystal display (LCD) devices, OLED devices are lighter and thinner, and have wider viewing angles and higher contrast. Thus, the OLED devices are becoming more and more popular.

In an existing OLED display panel, an optical resonant micro-cavity (also referred to as a micro-cavity structure) is adopted to adjust light-emitting characteristics. The micro-cavity structure has a multi-layer structure formed between two electrodes of the OLED display panel. The effects of reflection, total reflection, interference, refraction, or scattering, etc. on the interface of discontinuous refractive index are configured to confine the emitted light within a relatively small wavelength band. Through designing the cavity length and the thicknesses of the various layers in the micro-cavity, the wavelength center is configured to be located near the antinodes of the standing wave. Thus, the coupling efficiency of the radiation dipole and the electric field inside the micro-cavity is increased, and the light-emitting efficiency and brightness of the OLED display panel is improved.

In the existing technology, the cavity length of the micro-cavity structure corresponding to pixels of different colors may often be adjusted by the thickness of a hole transport layer to satisfy various performance requirements of the OLED display panel, such as, brightness, light-emitting efficiency, and color purity, etc. However, adjusting the cavity length of the micro-cavity structure by the thickness of the hole transport layer may cause serious crosstalk and degrade the display performance of the OLED display panel.

The disclosed OLED display panel and manufacturing method thereof are directed to solve one or more problems set forth above and other problems.

BRIEF SUMMARY OF THE DISCLOSURE

One aspect of the present disclosure provides an OLED display panel, comprising a substrate and a plurality of pixel regions disposed on the substrate and emitting light in different colors. A pixel region includes a first electrode, a first auxiliary light-emitting layer, a light-emitting layer, a second auxiliary light-emitting layer, and a second electrode, disposed in a direction far away from the substrate. A micro-cavity structure is formed between the first electrode and the second electrode. The second auxiliary light-emitting layer includes at least a first sub-auxiliary light-emitting layer. The second auxiliary light-emitting layer corresponding to the pixel regions emitting light in at least one color also includes a second sub-auxiliary light-emitting layer. At least one of the first sub-auxiliary light-emitting layer and the second sub-auxiliary light-emitting layer is made of at least a first electron-type material. The second sub-auxiliary light-emitting layer has a zero-field electron mobility greater than or equal to a pre-determined threshold.

Another aspect of the present disclosure provides a manufacturing method for the OLED display panel, comprising: forming a first electrode on a substrate having a plurality of pixel regions emitting light in different colors; forming a first auxiliary light-emitting layer on the first electrode; forming a light-emitting layer on the first auxiliary light-emitting layer; forming a second sub-auxiliary light-emitting layer on the light-emitting layer in at least one pixel region, wherein the second sub-auxiliary light-emitting layer has a zero-field electron mobility greater than or equal to a predetermined threshold; forming a first sub-auxiliary light-emitting layer on at least one of the second sub-auxiliary light-emitting layer and the light-emitting layer; and forming a second electrode on the first sub-auxiliary light-emitting layer, wherein at least one of the first sub-auxiliary light-emitting layer and the second sub-auxiliary light-emitting layer is made of a first electron-type material. The second sub-auxiliary light-emitting layer has the zero-field electron mobility greater than or equal to $1.0 \times 10^{-4}$ cm$^2$/V·S.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
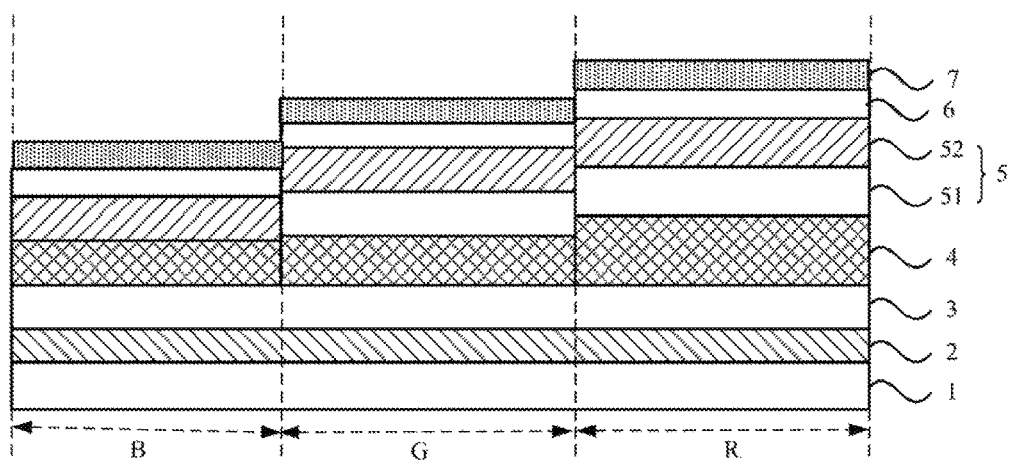
FIG. 1 illustrates a cross-sectional view of an exemplary OLED display panel according to the disclosed embodiments.

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings.

The present disclosure provides an OLED display panel, comprising a plurality of pixel regions disposed on a substrate and emitting light in different colors. Each pixel region may comprise a first electrode, a first auxiliary light-emitting layer, a light-emitting layer, a second auxiliary light-emitting layer, and a second electrode, which are disposed facing away from the substrate. A micro-cavity structure may be formed between the first electrode and the second electrode. The effective cavity length refers to an optical path length between the first electrode and the second electrode.

The second auxiliary light-emitting layer may include at least a first sub-auxiliary light-emitting layer. The second auxiliary light-emitting layer corresponding to at least one color may include a second sub-auxiliary light-emitting layer. At least one of the first sub-auxiliary light-emitting layer and the second sub-auxiliary light-emitting layer may be made of at least a first electron-type material. The second sub-auxiliary light-emitting layer may have a zero-field electron mobility greater than or equal to about $1.0 \times 10^{-4}$ cm$^2$/V·S.

The first auxiliary light-emitting layer, the light-emitting layer, and the second auxiliary light-emitting layer of the OLED display panel may be formed by a deposition process. The first auxiliary light-emitting layer may have a multi-layer structure. For example, the first auxiliary light-emitting layer may include a hole injection layer, a hole transport layer, and an electrode blocking layer. In addition to the first sub-auxiliary light-emitting layer, the second auxiliary light-emitting layer corresponding to at least one color, may also include a second sub-auxiliary light-emitting layer. At least one of the first sub-auxiliary light-emitting layer and the second sub-auxiliary light-emitting layer may be made of at least a first electron-type material. For example, the first sub-auxiliary light-emitting layer and the second sub-auxiliary light-emitting layer may be an electron transport layer.

The second auxiliary light-emitting layer may be a multi-layer structure. The second auxiliary light-emitting layer may include an electron transport layer, an electron injection layer, and a hole blocking layer. Because electrons and holes are injected to the light-emitting layer of the OLED display panel through the first electrode and the second electrode respectively, when the injected electrons and holes are recombined to form excitons transitioning from an excited state to a base state, the OLED display panel may emit light.

In the disclosed embodiments, the second sub-auxiliary layer may be configured to adjust the cavity length of the micro-cavity structure, such that the electron injection and transport path may be increased. The electron transport distance may be substantially longer than the hole transport distance, causing an imbalance of electrons and holes. Severe imbalance may cause the electron and hole recombination to deviate from the light-emitting layer, and may affect the light-emitting efficiency and life span of the OLED display panel.

Thus, in the disclosed embodiments, the second sub-auxiliary light-emitting layer made of the first electron-type material may be configured to adjust the cavity length, such that the crosstalk caused by employing the hole transport layer to adjust the cavity length of the micro-cavity structure in the existing technology may be suppressed. Meanwhile, the zero-field electron mobility of the second sub-auxiliary light-emitting layer may be adjusted to be greater than or equal to about $1.0 \times 10^{-4}$ cm$^2$/V·S, such that the imbalance of the electron and hole may be suppressed.

FIG. 1 illustrates a cross-sectional view of an exemplary OLED display panel according to the present disclosure. The OLED display panel may comprise a substrate 1, and a plurality of pixel regions disposed on the substrate 1 and emitting light in different colors. A pixel region may include a first electrode 2, a first auxiliary light-emitting layer 3, a light-emitting layer 4, a second auxiliary light-emitting layer 5, and a second electrode 6, which are disposed facing away from the substrate 1. Other appropriate components may also be included.

A micro-cavity structure may be formed between the first electrode 2 and the second electrode 6. The effects of reflection, total reflection, interference, diffraction, or scattering on the interface of the discontinuous refractive index in the micro-cavity structure may be adopted to confine the emitted light within a relatively small wavelength band. The cavity length and the thicknesses of the layers of the micro-cavity may be designed, such that the wavelength center of the emitted light may be configured to be located near the antinodes of the standing wave field. Thus, the coupling efficiency of the radiation dipole and the electric field inside the micro-cavity may be increased, and the light-emitting efficiency (i.e., luminous efficiency) and brightness of the device may be improved.

The second auxiliary light-emitting layer 5 may include at least a first sub-auxiliary light-emitting layer 52. The second auxiliary light-emitting layer 5 emitting light of at least one color may also include a second sub-auxiliary light-emitting layer 51. At least one of the first sub-auxiliary light-emitting layer 52 and the second sub-auxiliary light-emitting layer 51 may be made of at least a first electron-type material. The second sub-auxiliary light-emitting layer 51 may have a zero-field electron mobility greater than or equal to about $1.0 \times 10^{-4}$ cm$^2$/V·S.

In one embodiment, the zero-field electron mobility of the first sub-auxiliary light-emitting layer 52 may be configured to be greater than or equal to about $1.0 \times 10^{-4}$ cm$^2$/V·S. By adjusting the thicknesses of the first auxiliary light-emitting layer 3, the thicknesses of at least one of the first sub-auxiliary light-emitting layer 52 and the second sub-auxiliary light-emitting layer 51, the zero-field electron mobility of at least one of the first sub-auxiliary light-emitting layer 52 and the second sub-auxiliary light-emitting layer 51, and the hole mobility of the first auxiliary light-emitting layer 3, the electron injection and the hole injection may be balanced, and the electrons and holes may be assured to be recombined in the light-emitting layer 4.

In one embodiment, the first auxiliary light-emitting layer 3 may be configured to transport the holes produced by the first electrode 2 to the light-emitting layer 4. Thus, the electrons and holes may be recombined to generate excitons, and the OLED display panel may emit light. In another embodiment, the first auxiliary light-emitting layer 3 may be configured to prevent the electrons, which are transported from the cathode and then pass through the light-emitting layer 4, from moving toward the anode, such that the recombination region of the electrons and holes in the OLED display panel may be confined within the light-emitting layer 4.

The first auxiliary light-emitting layer 3 may be a single layer or multi-layer structure, which may be made of at least one of a hole injection layer material, a hole transport layer material, and an electron blocking layer material. Any appropriate material may be adopted for the first auxiliary light-emitting layer 3, which is not limited by the present disclosure.

In one embodiment, the second sub-auxiliary light-emitting layer 51 may be doped with at least one of ytterbium ion, lithium ion, or cesium ion, such that the zero-field electron mobility of the second sub-auxiliary light-emitting layer 51 may be configured to be greater than or equal to about $1.0 \times 10^{-4}$ cm$^2$/V·S. By increasing the zero-field electron mobility of the second sub-auxiliary light-emitting layer 51, the speed of the electron injection and transport may be accelerated. Thus, the imbalance of the electron and hole injection, which is caused by introducing the second sub-auxiliary light-emitting layer 51, may be resolved, and the light-emitting efficiency and life span of the OLED display panel may be improved.

In another embodiment, the first sub-auxiliary light-emitting layer 52 may be doped with at least one of ytterbium ion, lithium ion, and cesium ion, through which the zero-field electron mobility may be adjusted to be greater than or equal to about $1.0 \times 10^{-4}$ cm$^2$/V·S.

In another embodiment, both the second sub-auxiliary light-emitting layer 51 and the sub-auxiliary light-emitting layer 52 may be doped with at least one of ytterbium ion, lithium ion, and cesium ion, through which the zero-field electron mobility may be adjusted to be greater than or equal to about $1.0 \times 10^{-4}$ cm$^2$/V·S.

The first sub-auxiliary light-emitting layer 52 and the second sub-auxiliary light-emitting layer 51 may be made of the same material or different materials.

In certain embodiments, the first sub-auxiliary light-emitting layer 52 and the second sub-auxiliary light-emitting layer 51 may be made of the same material, which may simplify the manufacturing process. For example, when the first sub-auxiliary light-emitting layer 52 and the second sub-auxiliary light-emitting layer 51 are made of the same material, first sub-auxiliary light-emitting layer 52 and the second sub-auxiliary light-emitting layer 51 may be formed consecutively in a same chamber, avoiding the replacement of the fabrication chamber and the movement of the substrate.

Further, the first sub-auxiliary light-emitting layer 52 and the second sub-auxiliary light-emitting layer 51 may include the same host material or different host materials.

In certain embodiments, at least one of the first sub-auxiliary light-emitting layer 52 and the second sub-auxiliary light-emitting layer 51 may, for example, include at least one of tris(8-quinolinolato) aluminum (Alq3), PBD, TAZ, spiro-PBD, BAIq, and SAlq.

In certain embodiments, the cavity length of the micro-cavity structure corresponding to a pixel region may be positively correlated to the wavelength of the emitted light corresponding to the same pixel region. Referring to FIG. 1, the cavity lengths of the micro-cavity structures corresponding to pixel regions emitting light in different colors may be configured to be different. For example, the cavity length of the micro-cavity structure corresponding to the green pixel region G emitting green light may be shorter than the cavity length of the micro-cavity structure corresponding to the red pixel region R emitting red light, but longer than the cavity length of the micro-cavity structure corresponding to the blue pixel region B emitting blue light.

The OLED display panel may comprise a plurality of pixel regions emitting light in different colors. In one embodiment, as shown in FIG. 1, the pixel regions may include a plurality of red pixel regions R emitting red light, a plurality of green pixel regions G emitting green light, and a plurality of blue pixel region B emitting blue light (i.e., three primary colors RGB).

Because the wavelengths of red light, green light, and blue light are different, the pixel regions emitting light in different colors may be desired to have different cavity lengths. For example, the second sub-auxiliary light-emitting layer 51 may be disposed at least between the light-emitting layers 4 corresponding to the red pixel regions R and the green pixel regions G and the first sub-auxiliary light-emitting layer 52.

In one embodiment, for illustration purpose, the second sub-auxiliary light-emitting layer 51 may be disposed between the light-emitting layer 4 corresponding to the red pixel regions and the green pixel regions and the first sub-auxiliary light-emitting layer 52. In this case, the configuration of the second sub-auxiliary light-emitting layer 51 may eliminate a fabrication step for forming the second sub-auxiliary light-emitting layer 51 corresponding to the blue pixel regions B, such that the production cost may be reduced, and the production efficiency may be improved.

The thickness of the second auxiliary light-emitting layer 5 corresponding to the red pixel region R, the green pixel region G, and the blue pixel region B may be determined according to various application scenarios. In certain embodiments, the second auxiliary light-emitting layer 5 corresponding to the red pixel region R emitting red light may have a thickness ranging approximately between 205 nm and 230 nm. The second auxiliary light-emitting layer 5 corresponding to the green pixel region G emitting green light may have a thickness ranging approximately between 170 nm and 190 nm. The second auxiliary light-emitting layer 5 corresponding to the blue pixel region B emitting blue light may have a thickness ranging approximately between 120 nm and 135 nm.

Further, the thickness of the first auxiliary light-emitting layer 3 may be determined according to various application scenarios. In certain embodiments, the first auxiliary light-emitting layer 3 may have a thickness ranging approximately between 25 nm and 45 nm. The first auxiliary light-emitting layer 3 may be made of any one of N,N-dinaphthyl-N,N'0diphenylbenzidine (NPD), 4,4'-N,N'-dicarbazole-biphenyl (CBP, s-TAD, 4,4',4"-tris(N-3-methylphenyl-N-phenyl-amino)-triphenylamine (MTDATA), or other suitable material, which is not limited by the present disclosure.

The first auxiliary light-emitting layer 3 may have a zero-field hole mobility ranging approximately between about $1.2 \times 10^{-5}$ cm$^2$/V·S and about $9.0 \times 10^{-5}$ cm$^2$/V·S. The actual fabrication requirements may include factors such as the micro-cavity structure in pixel regions emitting light in different colors, the light-emitting layer characteristics, and the transport balance between holes and electrons in different pixel regions. For example, the thickness ratio of the first auxiliary light-emitting layer 3 over the second auxiliary light-emitting layer 5 in the red pixel region R may be configured to a range approximately between 3/20 and 7/40. The thickness ratio of the first auxiliary light-emitting layer 3 over the second auxiliary light-emitting layer 5 in the green pixel region G may be configured to a range approximately between 7/40 and 1/5. The thickness ratio of the first auxiliary light-emitting layer 3 over the second auxiliary light-emitting layer 5 in the blue pixel region B may be configured to a range approximately between 1/4 and 3/10.

By reducing the thickness of the first auxiliary light-emitting layer 3 and introducing the second auxiliary light-emitting layer 5, the cavity length of the micro-structure may be adjusted without introducing the crosstalk. That is, the crosstalk in the existing technology, which is caused by employing the hole transport layer to adjust the cavity length of the micro-cavity structure, may be suppressed. Meanwhile, the zero-field electron mobility of the second sub-auxiliary light-emitting layer may be adjusted, such that the imbalance of the electron and hole, which is caused by the electron injection of the second auxiliary light-emitting layer 5 as well as the extension of the electron transport path, may be suppressed.

The light-emitting layers 4 corresponding to the pixel regions emitting light in different colors may have a same thickness or different thicknesses. For example, in one embodiment, as shown in FIG. 1, the light-emitting layers 4 corresponding to the red pixel region R, the green pixel region G, and the blue pixel region B may have different thicknesses. As long as the light emitted from the light-emitting layer 4 corresponding to the pixel regions emitting light in different colors may be enhanced by the micro-cavity structure through luminance constructive interference, the light-emitting efficiency of the OLED display panel may be improved. In this case, the cavity length of the micro-cavity structure may be adjusted by the thickness of the layers disposed between the first electrode 2 and the second electrode 6 (e.g., the first auxiliary light-emitting layer 3, the light-emitting layer 4, and the second auxiliary light-emitting layer 5).

In certain other embodiments, at least one of the thickness of the light-emitting layer 4 and the thickness of the second sub-auxiliary light-emitting layer 51 corresponding to the same pixel region may be positively correlated with the wavelength of the light emitted by the corresponding pixel region. For example, in one embodiment, the light-emitting layer 4 corresponding to each pixel region may have a same thickness. The thickness of the second auxiliary light-emitting layer 5 may be adjusted to configure the cavity length of the micro-cavity structure to be positively correlated with the wavelength of the light emitted by the corresponding pixel region. In other embodiments, both the thickness of the light-emitting layer 4 and the thickness of the second auxiliary light-emitting layer 5 may be adjusted to configure the cavity length of the micro-cavity structure to be positively correlated with the wavelength of the light emitted by the corresponding pixel region.

Further, the OLED display panel according to the present disclosure may be a top emission type OLED display panel, a bottom emission type OLED display panel, or a dual emission type OLED display panel, which is not limited by the present disclosure. That is, at least one of the first electrode 2 and the second electrode 6 may be disposed at the light-emitting side of the OLED display panel.

When the second electrode 6 is disposed at the light-emitting side of the OLED display panel, the first electrode 2 may include at least a reflective electrode and at least a transparent conductive electrode. For example, the transparent conductive electrode may be made of ITO or IZO, and the reflective electrode may be made of Ag or a metal alloy containing Ag. In certain embodiments, when the second electrode 6 is configured as the light-emitting side of the OLED display panel, the second electrode 6 may have light transmittance ranging approximately between 30% and 50%. The second electrode 6 may, for example, be made of at least one of magnesium, silver, ytterbium, and a rare earth metal.

In certain embodiments, to increase the light-emitting efficiency of the OLED display panel, a light coupling organic layer (i.e., a capping layer) 7 may be disposed on the side of the second electrode 6 facing away from the substrate 1. The capping layer 7 may have a refractive index greater than the second electrode 6. The total light transmittance of the second electrode 6 and the capping layer 7 may be greater than about 60%. Through coordinating the refractive indexes of the capping layer 7 and the second electrode 6, the brightness enhancement effect of the micro-cavity structure may be improved, and the light-emitting efficiency of the OLED display panel may be increased.

In certain embodiments, the light-emitting layer 4 may include a host material, and a guest material (i.e., a dopant). At least one of the light-emitting layer 4 corresponding to the red pixel region R and the light-emitting layer 4 corresponding to the blue pixel region B may be made of one or two host materials. The light-emitting layer 4 corresponding to the green pixel region G may be made of at least two host materials.

In the light-emitting layer 4, the host material content may be more than the guest material content. Generally, the absolute value of a HOMO energy level $|T_{host}(HOMO)|$ of the host material may be greater than the absolute value of a HOMO energy level $|T_{dopant}(HOMO)|$ of the guest material, the absolute value of a LUMO energy level $|T_{host}(LUMO)|$ of the host material may be smaller than the absolute value of a LUMO energy level $|T_{dopant}(LUMO)|$ of the guest material, and a triplet state energy level $T_{host}(S)$ of the host material may be greater than a triplet state energy level $T_{dopant}(S)$ of the guest material. The triplet state energy of the host material may be effectively transferred to the guest material, and the light emission spectrum of the host material may match the light absorption spectrum of the guest material.

In addition, the guest material of the light-emitting layer 4 may include a phosphorescent or fluorescent material. For example, the guest material of the light-emitting layer 4 corresponding to the pixel region R emitting red light and the pixel region G emitting green light may be a phosphorescent material, and the guest material of the light-emitting layer 4 corresponding to the pixel region B emitting blue light may be a fluorescent material. The material of the light-emitting layer 4 is not limited by the present disclosure. For example, the light-emitting layer 4 may be made of a material other than the host-guest doping structure or made of a thermally activated delayed fluorescent (TADF) material.

At least one of the second sub-auxiliary light-emitting layer 51 and the first sub-auxiliary light-emitting layer 52 may be made of a first electron-type material. In one embodiment, the first electron-type material may include at least a first radical group. For example, the first radical group may have a conjugated structure containing at least three consecutive benzene rings. At least one carbon atom on the three consecutive benzene rings may be replaced by a nitrogen atom, and the first radical group may have an axially symmetric structure. The first radical group may have an exemplary skeletal structural formula such as

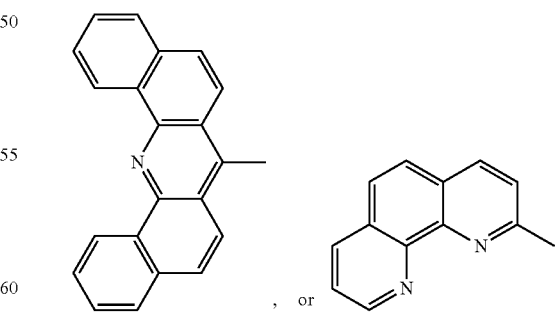

In the disclosed embodiments, the second sub-auxiliary light-emitting layers 51 having different electron mobility's may be included in the OLED display panel. The measurements of voltages and current efficiencies show that, when the second sub-auxiliary light-emitting layer 51 has an electron mobility greater than or equal to about $1.0 \times 10^{-4}$ cm$^2$/V·S, the current efficiency of the OLED device may be improved significantly.

TABLE 1

Comparing the test results of the OLED device when the second sub-auxiliary light-emitting layer is doped with different guest materials

| Structure | Zero-field electron mobility (cm$^2$/V · S) | Voltage required to reach a current density of 10 mA/cm (V) | Current efficiency (cd/A) |
|---|---|---|---|
| ETL1:Yb | $1.0 \times 10^{-4}$ | 3.23 | 3.81 |
| ETL2:Yb | $1.2 \times 10^{-4}$ | 3.11 | 4.17 |
| ETL3:Yb | $5.0 \times 10^{-5}$ | 4.89 | 2.03 |
| ETL3:LiQ | $3.0 \times 10^{-5}$ | 6.48 | 0.59 |
| ETL3:LiF | $9.0 \times 10^{-6}$ | 7.56 | 0.37 |

Table 1 compares the test results of the OLED device when the second sub-auxiliary light-emitting layer is doped with different guest materials. For ease of comparison, five samples in the table 1 may have the same structure including a first electrode including an Ag layer (100 nm thickness), an ITO layer (10 nm thickness), a first auxiliary light-emitting layer (35 nm thickness), a light-emitting layer (20 nm thickness), a second auxiliary light-emitting layer (125 nm thickness) including a first sub-auxiliary light-emitting layer and a second sub-auxiliary light-emitting layer, and a second electrode 6 (17 nm) including an Ag (17 nm thickness). The first sub-auxiliary light-emitting layer and the second sub-auxiliary light-emitting layer of the five samples in Table 1 may be made of a first electron-type material doped with a guest material.

As shown in Table 1, the zero-field electron mobility $\mu_0$ of the second auxiliary light-emitting layer (also known as electron transport layer or ETL) may vary substantially with the guest material. ETL3 may be made of a first electron-type material containing no first radical group, ETL1 may be made of a first electron-type material containing a first radical group

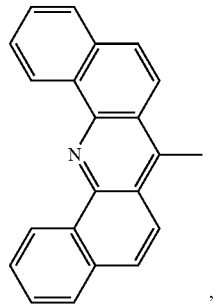 [SMILES: Cc1c2ccc3ccccc3c2nc2c1ccc1ccccc12]

and ETL2 may be made of a first electron-type material containing a first radical group

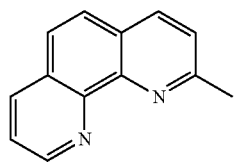

As shown in Table 1, the OLED device with ETL1:Yb (ETL1 doped with Yb) may have a voltage required to reach a current density of 10 mA/cm$^2$ at about 3.23V, and the OLED device with ETL2:Yb may have a voltage required to reach a current density of 10 mA/cm$^2$ at about 3.11V. Compared with the other three samples in Table 1 (i.e., the OLED device with ETL3:Yb, the OLED device with ETL3:LiQ, and the OLED device with ETL3:LiF), the OLED device with ETL1:Yb and the OLED device with ETL2:Yb may require smaller voltages and, thus, the power consumption of the OLED device may be reduced.

In addition, the OLED device with ETL1:Yb may have a current efficiency of about 3.81 cd/A, and the OLED device with ETL2:Yb may have a current efficiency of about 4.17 cd/A. Both OLED devices may have a significantly higher current efficiency than the other three samples (i.e., the OLED device with ETL3:Yb, the OLED device with ETL3:LiQ, and the OLED device with ETL3:LiF). Thus, the OLED device with ETL1:Yb and the OLED device with ETL2:Yb may have better carrier balance and transport effect, and may be more convenient to adjust the micro-cavity structure to achieve higher efficiency.

In the disclosed embodiments, a second sub-auxiliary light-emitting layer 51 may be disposed between the light-emitting layer 4 corresponding to at least one pixel region and the first sub-auxiliary light-emitting layer 52 to adjust the optical distance, i.e., the cavity length of the micro-cavity structure. Further, at least one of the first sub-auxiliary light-emitting layer 52 and the second sub-auxiliary light-emitting layer 51 may be made of the first electron-type material.

Compared with the existing technology which adjusts the cavity length of the micro-cavity structure by the thickness of the hole transport layer, the OLED display panel disclosed by the present disclosure may be able to suppress the crosstalk. In addition, the zero-field electron mobility of the second sub-auxiliary light-emitting layer 51 may be configured to be greater than or equal to about $1.0 \times 10^{-4}$ cm$^2$/V·S, which may prevent the imbalance of the electron and hole injection caused by an excessively thick total thickness of the first electron-type material layers after the second sub-auxiliary light-emitting layer 51 is introduced. Thus, the light-emitting efficiency and the life span of the OLED display panel may be increased.

Figure 2:
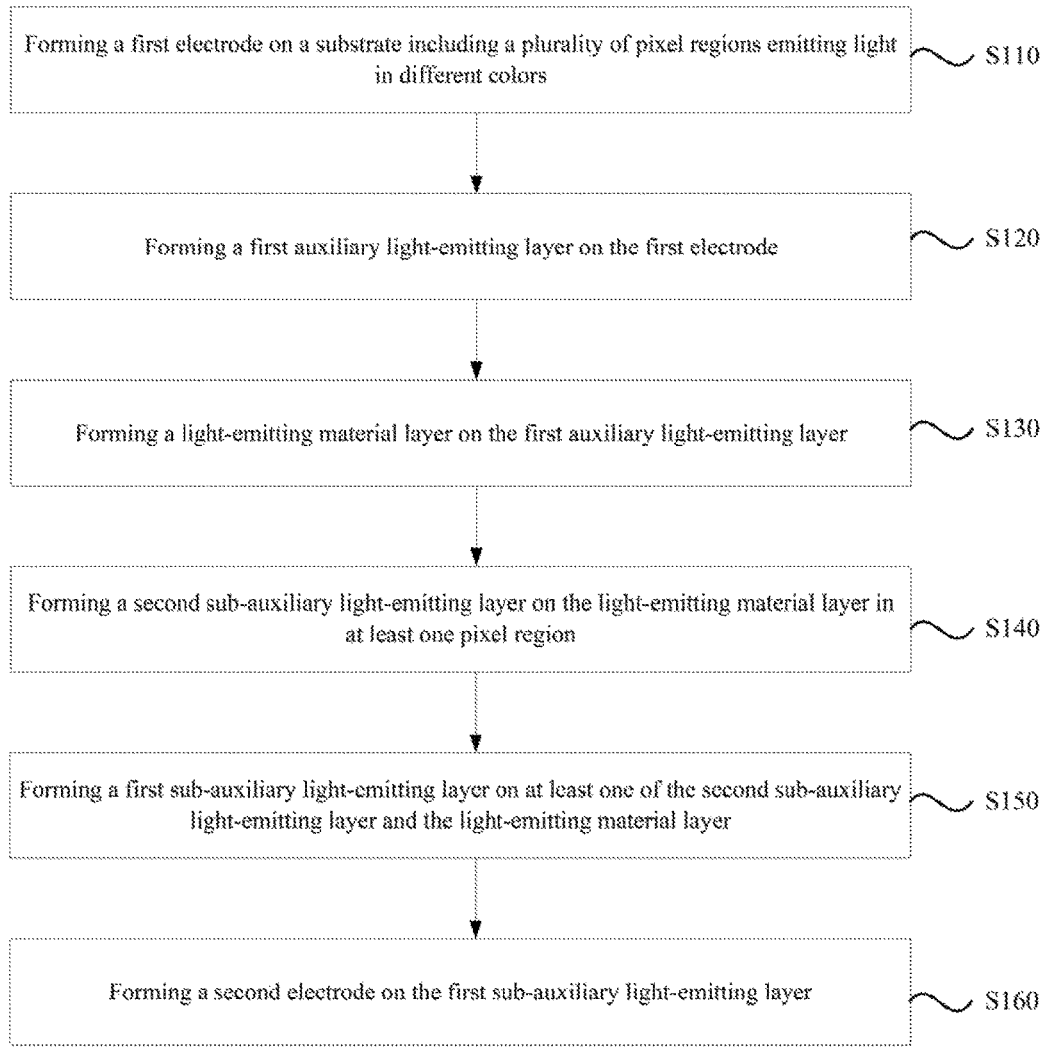
FIG. 2 illustrates a flow chart of an exemplary manufacturing method for the OLED display panel according to the disclosed embodiments.
Figure 3A:
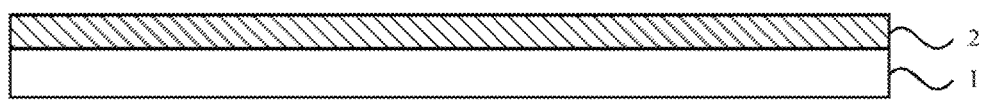
FIGS. 3a-3f illustrate cross-sectional views of an exemplary OLED display panel during certain stages of the manufacturing method in FIG. 2 according to the disclosed embodiments.

The present disclosure also provides a manufacturing method for the OLED display panel. FIG. 2 illustrates a flow chart of an exemplary manufacturing method for the OLED display panel according to the present disclosure. FIGS. 3a-3f illustrate cross-sectional views of an exemplary OLED display panel during certain stages of the manufacturing method in FIG. 2 according the present disclosure. As shown in FIG. 2, at the beginning, a first electrode is formed on a substrate including a plurality of pixel regions emitting light in different colors (S110). The corresponding structure is shown in FIG. 3a.

As shown in FIG. 3a, a first electrode 2 may be formed on a substrate 1. The first electrode 2 may be made of a high work function conductive material, suitable for hole injection, such as indium tin oxide (ITO).

In one embodiment, after the first electrode 2 is formed, a pixel defining layer (not shown in FIG. 3a) may be formed on the first electrode 2. The pixel defining layer may include a plurality of opening structures. Each opening structure may correspond to a pixel region.

In another embodiment, before the first electrode 2 is formed, a pixel defining layer (not shown in FIG. 3a) may be formed on the substrate 1. The pixel defining layer may include a plurality of opening structures. Then, a first electrode 2 may be formed in each opening structure. The pixel defining layer may prevent undesired color mixing issue in a subsequently formed light-emitting layer 4.

Returning to FIG. 2, after the first electrode is formed on the substrate, a first auxiliary light-emitting layer is formed on the first electrode (S120). The corresponding structure is shown in FIG. 3b.

Figure 3B:
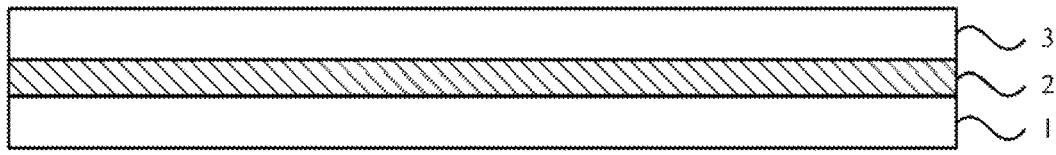

Referring to FIG. 3b, a first auxiliary light-emitting layer 3 may be deposited on the first electrode 2. In one embodiment, the first auxiliary light-emitting layer 3 may have a thickness ranging approximately between 25 nm and 45 nm, and a zero-field hole mobility ranging approximately between $1.2 \times 10^{-5}$ cm$^2$/V·S and $9.0 \times 10^{-5}$ cm$^2$/V·S. The first auxiliary light-emitting layer 3 may include, for example, a hole injection layer, a hole transport layer, and an electron blocking layer.

Returning to FIG. 2, after the first auxiliary light-emitting layer is formed on the first electrode, a light-emitting layer is formed on the first auxiliary light-emitting layer (S130). The corresponding structure is shown in FIG. 3c.

Figure 3C:
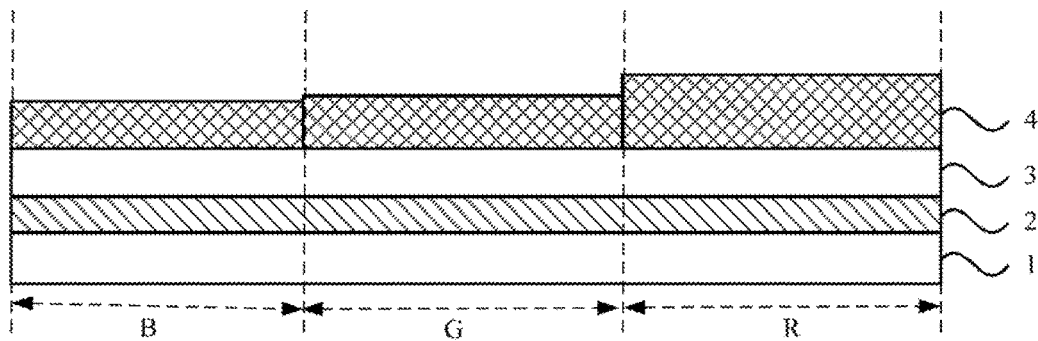

Referring to FIG. 3c, the light-emitting layer 4 is formed on the first auxiliary light-emitting layer 3. For pixel regions emitting light in different colors, the light-emitting layer 4 may be sequentially deposited by using masks. In FIG. 3c, three pixel regions emitting light in three colors are shown for illustration purpose, including a red pixel region R emitting red light, a green pixel region G emitting green light, and a blue pixel region B emitting blue light.

In certain embodiments, the light-emitting layers 4 corresponding to the pixel regions emitting light in different colors may have a same thickness, or different thicknesses. Specifically, the thickness of the light-emitting layer 4 may be determined according to various factors, such as the actual manufacturing requirements, the micro-cavity structures corresponding to the pixel regions emitting light in different colors, light-emitting layer characteristics, and the transport balances between holes and electrons in different pixel regions, etc.

In one embodiment, as shown in FIG. 3c, the light-emitting layers 4 corresponding to different pixel regions may be configured to have different thicknesses. The cavity length of the micro-cavity structure in the pixel region may be adjusted by the thicknesses of the layers (including the first auxiliary light-emitting layer 3, the light-emitting layer 4, and the second auxiliary light-emitting layer 5) disposed between the first electrode 2 and the second electrode 6, such that light emitted from the light-emitting layer 4 in the pixel region may be enhanced by a luminance constructive interference in the micro-cavity structure. Thus, the light-emitting efficiency of the OLED display panel may be improved, and the fabrication process may be simplified.

Returning to FIG. 2, after the light-emitting layer is formed on the first auxiliary light-emitting layer, a second sub-auxiliary light-emitting layer is formed on the light-emitting layer corresponding to a pixel region emitting light in at least one color (S140). The second sub-auxiliary light-emitting layer has a zero-field electron mobility greater than or equal to approximately $1.0 \times 10^{-4}$ cm$^2$/V·S. The corresponding structure is shown in FIG. 3d.

Figure 3D:
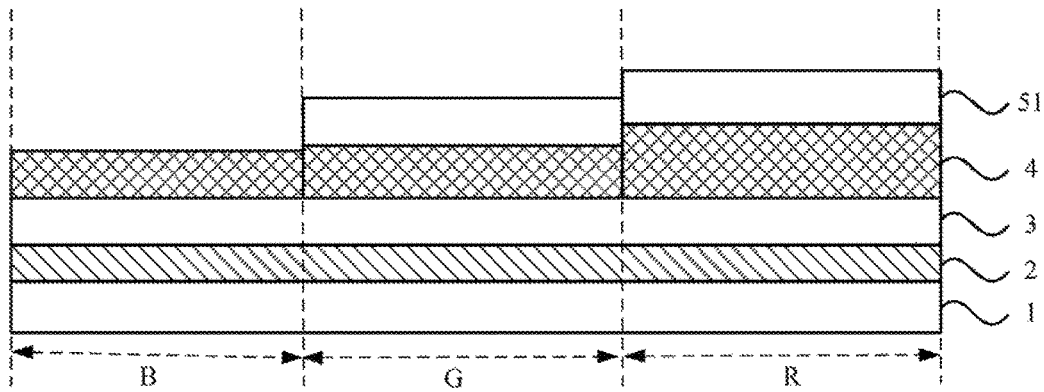

Referring to FIG. 3d, in one embodiment, the second sub-auxiliary light-emitting layer 51 may be disposed on the light-emitting layer 4 corresponding to the red pixel region R and the light-emitting layer 4 corresponding to the green pixel region G, respectively.

Returning to FIG. 2, after the second sub-auxiliary light-emitting layer is formed on at least one light-emitting layer, a first sub-auxiliary light-emitting layer is formed on at least one of the second sub-auxiliary light-emitting layer and the light-emitting layer (S150). The corresponding structure is shown in FIG. 3e.

Figure 3E:
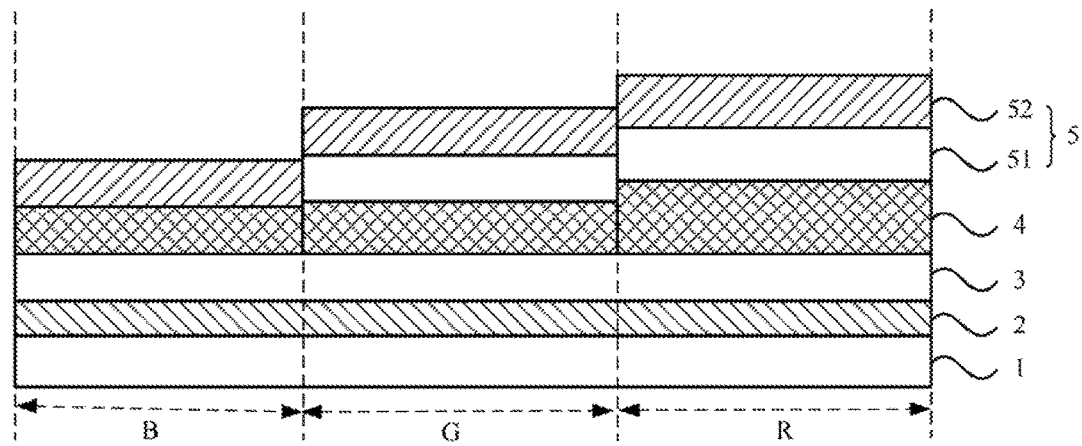

Referring to FIG. 3e, in one embodiment, a first sub-auxiliary light-emitting layer 52 may be formed on the light-emitting layer 4 corresponding to the red pixel region R, the light-emitting layer 4 corresponding to the green pixel region G, and the light-emitting layer 4 corresponding to the blue pixel region B, respectively. The first sub-auxiliary light-emitting layer 52 may include an electron transport layer, an electron injection layer, and a hole blocking layer.

Returning to FIG. 2, after the first sub-auxiliary light-emitting layer is formed on at least one of the second sub-auxiliary light-emitting layer and the light-emitting layer, a second electrode is formed on the first sub-auxiliary light-emitting layer (S160). The corresponding structure is shown in FIG. 3f.

Figure 3F:
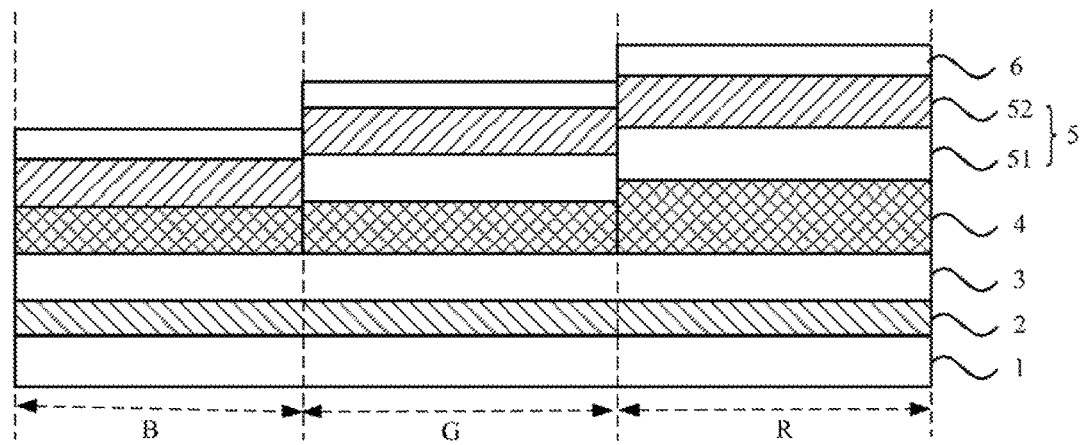

Referring to FIG. 3f, in one embodiment, a second electrode 6 may be formed on the first sub-auxiliary light-emitting layer 52. The second electrode 6 may be made of, for example, a low work function conductive material, facilitating electron injection.

When both the first electrode 2 and the second electrode 6 are a plurality of stripe-shaped electrodes arranged in parallel, and are configured to intersect with each other, the electrode structure may be applicable to a passive OLED display panel. When the first electrode 2 is a plurality of block-shaped electrodes arranged in matrix, and the second electrode 6 is a plate-shaped electrode (i.e., one second electrode 6 is shared by all pixel regions), the electrode structure may be applicable to an active OLED display panel.

The disclosed OLED display panel may be a bottom emission type OLED display panel, a top emission type OLED display panel, or a dual emission type OLED display panel. The light-emitting direction of the OLED display panel is not limited by the present disclosure. That is, at least one of the first electrode 2 and the second electrode 6 may be disposed at the light-emitting side of the OLED display panel. When the electrode 6 is disposed at the light-emitting side of the OLED display panel, the first electrode 2 may include at least a reflective electrode and at least a transparent conductive electrode. The transparent conductive electrode may be made of, for example, ITO or IZO, and the reflective electrode may be made of, for example, Ag or a metal alloy containing Ag.

In one embodiment, when the second electrode 6 is disposed at the light-emitting side of the OLED display panel, the second electrode 6 may be configured to have light transmittance ranging approximately between 30% and 50%.

In one embodiment, as shown in FIG. 1, a light coupling organic layer 7 may be disposed on the side of the second electrode 6 facing away from the substrate 1 to increase the light-emitting efficiency of the OLED display panel. The light coupling organic layer 7 may have a refractive index greater than the second electrode 6. The total light transmittance of the second electrode 6 and the light coupling organic layer 7 may be greater than about 60%.

In one embodiment, when the second electrode 6 is disposed at the light-emitting side of the OLED display panel, the second electrode 6 may be made of, for example, at least one of MgAg alloy, Ag, AgYb alloy, and a metal alloy containing Ag and a rare earth metal.

In one embodiment, the light-emitting layer 4 may include a host material and a guest material. At least one of the light-emitting layer 4 corresponding to the red pixel region R and the light-emitting layer 4 corresponding to the blue pixel region B may include one or two host materials. The light-emitting layer 4 corresponding to the green pixel region G may include at least two host materials. In addition, the guest material of the light-emitting layer 4 may be a phosphorescent material or a fluorescent material. For example, the guest material of the light-emitting layer 4 corresponding to the red pixel region R and the green pixel region G may be the phosphorescent material. The guest material of the light-emitting layer 4 corresponding to the blue pixel region B may be the fluorescent material. The guest material selection is not limited by the present disclosure.

At least one of the second sub-auxiliary light-emitting layer 51 and the first sub-auxiliary light-emitting layer 52 may be made of at least a first electron-type material. In one embodiment, the first electron-type material may include at least a first radical group. The first radical group may be a conjugated structure containing at least three consecutive benzene rings. At least one carbon atom on the three consecutive benzene rings may be replaced by a nitrogen atom, and the first radical group may be an axially symmetric structure. The skeletal structural formula of the first radical group may include, for example,

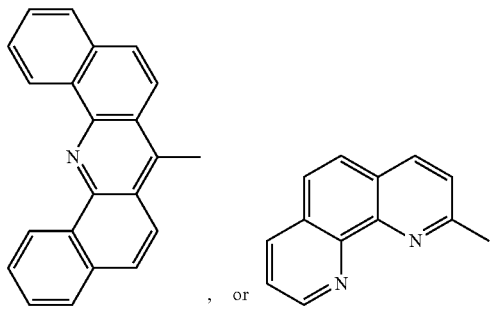

, or  .

In one embodiment, the first sub-auxiliary light-emitting layer 52 may have a zero-field electron mobility greater than or equal to approximately $1.0 \times 10^{-4}$ cm$^2$/V·S.

In one embodiment, the second sub-auxiliary light-emitting layer 51 may be doped with at least one of ytterbium ion, lithium ion, and cesium ion to adjust the zero-field electron mobility to be greater than or equal to approximately $1.0 \times 10^{-4}$ cm$^2$/V·S.

In one embodiment, the first sub-auxiliary light-emitting layer 52 may be doped with at least one of ytterbium ion, lithium ion, and cesium ion to adjust the zero-field electron mobility to be greater than or equal to approximately $1.0 \times 10^{-4}$ cm$^2$/V·S.

In one embodiment, the first sub-auxiliary light-emitting layer 52 and the second sub-auxiliary light-emitting layer 51 may be made of the same material.

In one embodiment, the host material of the second sub-auxiliary light-emitting layer 51 and the first sub-auxiliary light-emitting layer 52 may be the same or different.

In one embodiment, the cavity length of the micro-cavity structure in a pixel region may be positively correlated with the wavelength of the light emitted from the corresponding pixel region.

In certain embodiments, the second auxiliary light-emitting layer 5 corresponding to the red pixel region R may have a thickness ranging approximately between 205 nm and 230 nm. The second auxiliary light-emitting layer 5 corresponding to the green pixel region G may have a thickness ranging approximately between 170 nm and 190 nm. The second auxiliary light-emitting layer 5 corresponding to the blue pixel region B may have a thickness ranging approximately between 120 nm and 135 nm.

In certain embodiments, the first auxiliary light-emitting layer 3 and the second auxiliary layer 5 in the red pixel region R may have a thickness ratio ranging approximately between 3/20 and 7/40. The first auxiliary light-emitting layer 3 and the second auxiliary layer 5 in the green pixel region G may have a thickness ratio ranging approximately between 7/40 and 1/5. The first auxiliary light-emitting layer 3 and the second auxiliary layer 5 in the blue pixel region B may have a thickness ratio ranging approximately between 1/4 and 3/10.

In the OLED display panel and the manufacturing method thereof disclosed by the present disclosure, the second sub-auxiliary light-emitting layer may be disposed between the light-emitting layer and the first sub-auxiliary light-emitting layer to adjust an optical distance, i.e., a cavity length of the micro-cavity structure, and at least one of the first sub-auxiliary light-emitting layer and the second sub-auxiliary light-emitting layer made be made of at least a first electron-type material. Comparing with the existing technology which adjusts the cavity length of the micro-cavity structure by the thickness of the hole transport layer, the disclosed OLED display panel and manufacturing method thereof may suppress the crosstalk of the OLED display panel. At the same time, in the disclosed OLED display panel, the second sub-auxiliary light-emitting layer may have a zero-field electron mobility greater than or equal to approximately $1.0 \times 10^{-4}$ cm$^2$/V·S. Thus, the desired transport balance of carriers may be achieved, the efficiency of the OLED display panel may be improved, and the life span of the OLED display panel may be extended.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:
1. An organic light-emitting diode (OLED) display panel, comprising:
 a substrate; and
 a plurality of pixel regions disposed on the substrate and emitting light in different colors, wherein a pixel region includes a first electrode, a first auxiliary light-emitting layer, a light-emitting layer, a second auxiliary light-emitting layer, and a second electrode, disposed in a direction far away from the substrate;
 a micro-cavity structure is formed between the first electrode and the second electrode;
 the second auxiliary light-emitting layer includes at least a first sub-auxiliary light-emitting layer;
 the second auxiliary light-emitting layer corresponding to the pixel regions emitting light in at least one color also includes a second sub-auxiliary light-emitting layer;

at least one of the first sub-auxiliary light-emitting layer and the second sub-auxiliary light-emitting layer is made of at least a first electron-type material;

the second sub-auxiliary light-emitting layer has a zero-field electron mobility greater than or equal to a predetermined threshold;

the first electron-type material includes a first radical group;

the first radical group is a conjugated structure containing at least three consecutive benzene rings;

at least one of the three consecutive benzene rings has a carbon atom replaced by a nitrogen atom;

the first radical group is an axially symmetric structure; and the first radical group has a skeletal structural formula of

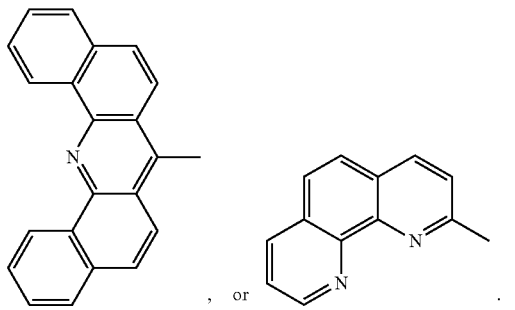 [SMILES: Cc1c2ccc3ccccc3c2nc2c1ccc1ccccc12 ; Cc1ccc2ccc3cccnc3c2n1]

, or .

2. The OLED display panel according to claim 1, wherein:
the second sub-auxiliary light-emitting layer has the zero-field electron mobility greater than or equal to $1.0 \times 10^{-4}$ $cm^2/V \cdot S$.

3. The OLED display panel according to claim 2, wherein:
the first sub-auxiliary light-emitting layer has the zero-field electron mobility greater than or equal to approximately $1.0 \times 10^{-4}$ $cm^2/V \cdot S$.

4. The OLED display panel according to claim 3, wherein:
the first sub-auxiliary light-emitting layer is doped with at least one of ytterbium ion, lithium ion, and cesium ion.

5. The OLED display panel according to claim 1, wherein:
the second sub-auxiliary light-emitting layer is doped with at least one of ytterbium ion, lithium ion, and cesium ion.

6. The OLED display panel according to claim 1, wherein:
the first sub-auxiliary light-emitting layer is made of a same material as the second sub-auxiliary light-emitting layer; and
the first sub-auxiliary light-emitting layer includes a same host material as the second sub-auxiliary light-emitting layer.

7. The OLED display panel according to claim 1, wherein:
a cavity length of the micro-cavity structure in the pixel region is positively correlated with a wavelength of light emitted from the corresponding pixel region; and
the cavity length is an optical path distance between the first electrode and the second electrode.

8. The OLED display panel according to claim 1, wherein:
the plurality of pixel regions includes a plurality of red pixel regions, a plurality of green pixel regions, and a plurality of blue pixel regions; and
at least in a red pixel region and a green pixel region, the second sub-auxiliary light-emitting layer is disposed between the light-emitting layer and the first sub-auxiliary light-emitting layer.

9. The OLED display panel according to claim 8, wherein:
the second auxiliary light-emitting layer in the red pixel region has a thickness ranging approximately between 205 mn and 230 nm;
the second auxiliary light-emitting layer in the green pixel region has a thickness ranging approximately between 170 nm and 190 nm; and
the second auxiliary light-emitting layer in a blue pixel region has a thickness ranging approximately between 120 nm and 135 nm.

10. The OLED display panel according to claim 8, wherein:
the first auxiliary light-emitting layer and the second auxiliary light-emitting layer in the red pixel region has a thickness ratio ranging approximately between 3/20 and 7/40;
the first auxiliary light-emitting layer and the second auxiliary light-emitting layer in the green pixel region has a thickness ratio ranging approximately between 7/40 and 1/5; and
the first auxiliary light-emitting layer and the second auxiliary light-emitting layer in a blue pixel region has a thickness ratio ranging approximately between 1/4 and 3/10.

11. The OLED display panel according to claim 8, wherein:
the light-emitting layer in the red pixel region and the light-emitting layer in the green pixel region are made of a phosphorescent material; and
the light-emitting layer in a blue pixel region is made of a fluorescent material.

12. The OLED display panel according to claim 8, wherein:
at least one of the light-emitting layer in the red pixel region and the light-emitting layer in a blue pixel region includes one or two host materials; and
the light-emitting layer in the green pixel region includes at least two host materials.

13. The OLED display panel according to claim 1, wherein:
the first auxiliary light-emitting layer has a thickness ranging approximately between 25 nm and 45 nm; and
the first auxiliary light-emitting layer has the zero-field hole mobility ranging approximately between $1.2 \times 10^{-5}$ $cm^2/V \cdot S$ and $9.0 \times 10^{-5}$ $cm^2/V \cdot S$.

14. The OLED display panel according to claim 1, wherein:
the light-emitting layer in all pixel regions has a same thickness.

15. The OLED display panel according to claim 1, wherein:
at least one of the light-emitting layer and the second sub-auxiliary light-emitting layer in the plurality of pixel regions has a thickness positively correlated with a wavelength of light emitted from the plurality of pixel regions.

16. The OLED display panel according to claim 1, wherein:
at least one of the first electrode and the second electrode is disposed at a light-emitting side of the OLED display panel.

17. The OLED display panel according to claim 16, wherein:
the second electrode is disposed at the light-emitting side of the OLED display panel; and
the first electrode includes at least a reflective electrode and at least a transparent conductive electrode.

18. The OLED display panel according to claim 17, wherein:
- the second electrode is made of at least one of MgAg alloy, Ag, AgYb alloy, and a metal alloy containing Ag and a rare earth metal;
- the second electrode has light transmittance ranging approximately between 30% and 50%;
- a light coupling organic layer is formed on a side of the second electrode facing away from the substrate; and
- the light coupling organic layer has a refractive index greater than the refractive index of the second electrode.

* * * * *